United States Patent
Queen et al.

(10) Patent No.: US 9,472,619 B2
(45) Date of Patent: Oct. 18, 2016

(54) PRINTING SLEEVE INCLUDING MELTABLE POLYMERIC CORD REINFORCING LAYER OR POLYMERIC REINFORCING LAYER

(71) Applicant: Day International, Inc., Plymouth, MI (US)

(72) Inventors: Mark Queen, Fletcher, NC (US); Richard Czerner, Weaverville, NC (US); Creg Bradley, Asheville, NC (US); David Blender, Rutherfordton, NC (US)

(73) Assignee: Day International, Inc., Plymouth, MI (US)

( * ) Notice: Subject to any disclaimer, the term of this patent is extended or adjusted under 35 U.S.C. 154(b) by 244 days.

(21) Appl. No.: 13/832,173

(22) Filed: Mar. 15, 2013

(65) Prior Publication Data

US 2014/0113785 A1    Apr. 24, 2014

Related U.S. Application Data

(60) Provisional application No. 61/717,992, filed on Oct. 24, 2012.

(51) Int. Cl.
| | |
|---|---|
| *F16C 13/00* | (2006.01) |
| *H01L 29/10* | (2006.01) |
| *B41F 3/46* | (2006.01) |

(Continued)

(52) U.S. Cl.
CPC ............ *H01L 29/1033* (2013.01); *B41F 3/46* (2013.01); *B41F 17/08* (2013.01); *B41N 10/04* (2013.01); *H01L 21/0332* (2013.01); *H01L 29/0673* (2013.01); *H01L 29/6656* (2013.01); *H01L 29/66545* (2013.01); *H01L 29/66795* (2013.01); *H01L 29/785* (2013.01);

(Continued)

(58) Field of Classification Search
CPC .............. F16C 13/00; F16C 2324/16; G03G 15/0233; G03G 15/0808; G03G 15/0815; G03G 15/0818; G03G 15/00683; B41F 7/26; B41F 7/36; B41F 31/26; Y10T 29/49544; Y10T 29/49547; Y10T 29/49554
See application file for complete search history.

(56) References Cited

U.S. PATENT DOCUMENTS

| | | |
|---|---|---|
| 3,235,772 A | 2/1966 | Gurin |
| 5,016,973 A | 5/1991 | Hager et al. |

(Continued)

FOREIGN PATENT DOCUMENTS

| | | |
|---|---|---|
| EP | 0613791 A2 | 9/1994 |
| WO | 94/02259 A1 | 2/1994 |
| WO | WO 2012/026355 A1 * | 3/2012 |

OTHER PUBLICATIONS

Partial Search Report from PCT application No. PCT/US2013/031867 mailed Jan. 8, 2014.

(Continued)

*Primary Examiner* — Christopher Besler
(74) *Attorney, Agent, or Firm* — Dinsmore & Shohl LLP

(57) ABSTRACT

A printing sleeve is provided which includes a reinforcing layer formed from a polymeric cord reinforcing material which softens and flows at a temperature less than that used in the final curing step of forming the sleeve or a polymeric reinforcing material having a thickness of between about 0.003 inches and 0.010 inches. The reinforcing layer provides a smooth surface to support an outer print surface layer and provides improved print performance while enabling a reduction in the overall thickness of the reinforcing layer.

18 Claims, 3 Drawing Sheets

(51) Int. Cl.
*B41F 17/08* (2006.01)
*B41N 10/04* (2006.01)
*H01L 21/033* (2006.01)
*H01L 29/06* (2006.01)
*H01L 29/66* (2006.01)
*H01L 29/78* (2006.01)

(52) U.S. Cl.
CPC ...... *B41N 2210/04* (2013.01); *B41N 2210/14* (2013.01); *Y10T 156/10* (2015.01)

(56) References Cited

U.S. PATENT DOCUMENTS

| | | |
|---|---|---|
| 5,700,343 A | 12/1997 | Castelli et al. |
| 6,148,865 A | 11/2000 | Head |
| 6,228,448 B1 | 5/2001 | Ndebi et al. |
| 7,942,993 B2 | 5/2011 | Gessler et al. |
| 2003/0140805 A1 | 7/2003 | Hertzog |
| 2006/0269800 A1 | 11/2006 | Ogawa et al. |
| 2006/0280928 A1* | 12/2006 | Imasaka et al. ........... 428/304.4 |
| 2007/0101884 A1 | 5/2007 | Czerner |
| 2009/0142587 A1 | 6/2009 | Byers et al. |
| 2010/0267537 A1* | 10/2010 | Kashihara .......... G03G 15/0233 492/18 |
| 2011/0110690 A1* | 5/2011 | Lim et al. ..................... 399/286 |
| 2012/0094223 A1* | 4/2012 | Kano et al. .................... 430/56 |
| 2012/0288306 A1* | 11/2012 | Ikegami et al. .............. 399/130 |

OTHER PUBLICATIONS

Partial Search Report from PCT application No. PCT/US2013/031942 mailed Jan. 7, 2014.
Office Action dated Aug. 7, 2014 pertaining to U.S. Appl. No. 13/832,854.

\* cited by examiner

PRINTING SLEEVE INCLUDING MELTABLE POLYMERIC CORD REINFORCING LAYER OR POLYMERIC REINFORCING LAYER

CROSS REFERENCE TO RELATED APPLICATIONS

This application claims the benefit of U.S. patent application Ser. No. 61/717,992, entitled PRINTING SLEEVE INCLUDING MELTABLE CORD OR POLYMERIC REINFORCING LAYER. The entire contents of said application is hereby incorporated by reference.

BACKGROUND OF THE INVENTION

Embodiments of the invention relate to a printing sleeve for use in lithographic printing including a compressible layer and a reinforcing layer, and more particularly, to a printing sleeve including a polymeric cord reinforcing layer or a polymeric reinforcing layer which provides a smooth surface to support an outer print surface layer to provide improved print performance while enabling a reduction in the overall thickness of the reinforcing layer.

One of the most common commercial printing processes is offset lithography. In this printing process, ink is offset from a printing plate to a rubber-surfaced printing blanket or sleeve before being transferred to a substrate, such as paper. Where a printing sleeve is used, it is typically constructed using a thin metal or reinforced polymer cylindrical base or carrier, and then the layers comprising the sleeve are attached to the carrier. Such layers can include one or more compressible layers, one or more reinforcing layers, and an outer print surface layer.

The reinforcing layer for current commercial sleeves typically comprises a spun cord layer, which is comprised of materials such as polyester, nylon, polyimide, or para-aramid, such as Kevlar®. The spun cord layer stabilizes and reinforces the other functional layers on the sleeve. However, a disadvantage of such spun cord materials is that the resulting reinforcing layer does not exhibit surface uniformity, which can result in the problem of threads or textures from the underlying reinforcement layer causing non-uniformities in the printing face, and ultimately the printed image. In addition, the reinforcing layer is typically about 0.008 to 0.010 inches (0.2 mm to 0.254 mm) in thickness. In order to improve print quality, it would be desirable to provide a printing sleeve (or blanket) in which the reinforcing layer has a reduced thickness and which does not cause non-uniformities in the printing face. Such a thinner reinforcing layer would allow the use of a thicker compressible layer without increasing the overall thickness of the sleeve. This, in turn, would avoid undesirable compression set and improve print quality. Accordingly, there is a need in the art for a printing sleeve which provides improved print performance.

SUMMARY

Embodiments of the invention meet those needs by providing a printing sleeve including a reinforcing layer which provides a uniformly smooth surface while stabilizing the printing surface layer to provide improved print quality and increase the life of the sleeve. The reinforcing layer may comprise a polymeric cord reinforcing layer which is "meltable," i.e., melts and flows at the temperatures used in the final curing step of forming the sleeve. By "cord," we mean monofilament materials as well as multiple filament materials. The melting causes the polymer to flow toward and bond to adjacent cords, resulting in a thinner structure than that of the cord layer prior to melting as well as producing a smoother, more uniform surface. Alternatively, the reinforcing layer may comprise a polymeric material.

The use of a meltable cord reinforcing layer replaces traditional spun cord layers which are comprised of higher melting temperature materials which do not soften or melt during fabrication of the sleeve or blanket. The meltable cord and polymeric reinforcing materials also provide a thinner and more uniformly smooth reinforcing layer which is less disruptive to the print surface layer, resulting in higher quality printing. The use of a reinforcing layers described herein also allows the use of a thicker compressible layer, which aids in stabilizing the printing surface during printing operations, reduces heat building during printing and reduces the likelihood of undesirable streaking of the printed image.

According to one aspect of the invention, a printing sleeve is provided which comprises a compressible layer and a first polymeric cord reinforcing layer wound around the compressible layer, wherein at least a portion of adjacent windings of the cord reinforcing layer have flowed together and bonded to form a reinforcing layer having reduced thickness. The sleeve further includes a printing surface layer on the cord reinforcing layer. The sleeve may further comprise a base layer supporting the compressible layer. The base layer may be comprised of an expandable material such as nickel or fiberglass.

In one embodiment, the first polymeric cord reinforcing layer comprises a material which softens and flows at a temperature of between about 100° C. and 200° C. In one embodiment, the first polymeric cord reinforcing layer comprises a spun cord. In another embodiment, the first polymeric cord reinforcing layer comprises a material selected from fluorinated ethylene propylene, linear low density polyethylene, polyethylene, polypropylene, nylon copolymers, polyester copolymers, high density polyethylene, and ethylene/propylene copolymers. Prior to heating or curing, the first polymeric cord reinforcing layer preferably has a thickness between about 0.008 to about 0.010 inches (0.20 to 0.25 mm). After heating or curing, the reinforcing layer has a thickness between about 0.003 to 0.008 inches (0.076 to 0.2032 mm), and more preferably, about 0.003 to 0.005 inches (0.076 mm to 0.127 mm).

The compressible layer preferably comprises nitrile rubber or other rubber or elastomer materials including ethylene/propylene rubber, EPDM, butyl rubber, fluoroelastomers, polyurethane, and blends thereof. The compressible layer is volume compressible and contains voids therein comprising microspheres or voids produced by techniques known in the art such as gas injection or by the introduction of chemical blowing agents.

The thickness of the compressible layer is from about 0.021 to 0.025 inches (0.53 mm to 0.63 mm). This is an increase in comparison with compressible layers included in certain commercial sleeves, which typically have a thickness of between about 0.017 to 0.020 inches (0.43 to 0.51 mm). It should be appreciated that the thickness of the compressible layer may vary according to the total sleeve thickness. Printing sleeves are typically manufactured at various thicknesses ranging from about 0.052 inches to 0.105 inches. For example, for a sleeve having a total thickness of 0.105 inches, the compressible layer, when used in conjunction with the reinforcing layer described herein, has a thickness of about 0.0555 to 0.0595 inches (1.4097 to 1.5113 mm). For a sleeve having a thickness of 0.092 inches, the compressible layer would have a thickness of about 0.0495 to 0.0535 inches (1.2573 to 1.3589 mm), and for a sleeve having a thickness of 0.072 inches, the compressible layer would have a thickness of about 0.0395 to 0.0435 inches (1.0033 to 1.1049 mm). This represents an increase in the compressible layer thickness of current commercial print sleeves having the respective total thicknesses.

The print surface layer preferably comprises nitrile rubber but may also comprise other rubber or elastomer materials including ethylene/propylene rubber, EPDM, butyl rubber, fluoroelastomers, polyurethane, and blends thereof.

In one embodiment, the printing sleeve may comprise a second cord reinforcing layer positioned below the first cord reinforcing layer. The second cord reinforcing layer may comprise a conventional spun cord material which does not melt at the curing temperatures described above, i.e., a spun cord material having a melting point greater than about 200° C. The second cord reinforcing layer is preferably comprised of a polymeric material selected from spun polyester, polyamide, polyimide, and aramid fibers.

In another alternative embodiment, the first cord reinforcing layer may comprise a hybrid layer comprising a first polymeric cord material which flows at temperatures used to cure the sleeve and a second, non-meltable cord reinforcing material, i.e., a material having a melting point greater than about 200° C. Thus, in this embodiment, the reinforcing layer comprises both meltable cords and non-melting cords, such that when the meltable cords are heated/cured, they flow around the non-melting cords to provide a surface that is more uniform (i.e., smoother) than the use of conventional spun cord alone.

In an alternative embodiment of the invention, a printing sleeve is provided which comprises a compressible layer; a polymeric reinforcing layer over the compressible layer; and a printing surface layer; where the polymeric reinforcing layer comprises a film having a thickness of between about 0.003 to 0.008 inches (0.076 to 0.20 mm). The polymeric reinforcing layer is comprised of a polymeric material selected from rubber, and thermoplastic polymers or thermosetting polymers including polyester, polycarbonate, and rigid polyurethane.

In one embodiment, the polymeric reinforcing layer includes reinforcing materials selected from chopped fiberglass, woven and nonwoven fabrics, pulp, chopped fibers, continuous filaments, cords, and fillers to aid in providing the required tensile modulus for stabilization of the print layer. The fillers may comprise carbon black, clay or silica.

In one method of making the printing sleeve, a compressible layer is provided, and a first polymeric cord reinforcing layer is wound around the compressible layer. A printing surface layer is then applied on the cord reinforcing layer. The layers in the sleeve are then cured at a temperature above the melting point or softening point of the polymeric cord reinforcing layer such that the reinforcing layer softens and flows. The sleeve is preferably cured at a temperature between about 225° F. and 350° F. (107° C. to 177° C.).

In an alternative method of making the printing sleeve, a polymeric reinforcing layer is applied over a compressible layer, where the polymeric reinforcing layer comprises a film having a thickness between about 0.003 inches and 0.010 inches (0.076 to 0.25 mm). A printing surface layer is applied over the polymeric reinforcing layer. In one embodiment, the polymeric reinforcing layer is applied in the form of a film. In another embodiment, the polymeric reinforcing layer is applied in the form of a coating.

Accordingly, it is a feature of embodiments of the invention to provide a printing sleeve including a meltable cord reinforcing layer or a polymeric reinforcing layer which improves the printing performance of the sleeve. These, and other features and advantages of the invention will become apparent from the following detailed description, the accompanying drawings, and the appended claims.

DETAILED DESCRIPTION OF THE PREFERRED EMBODIMENTS

Figure 1:
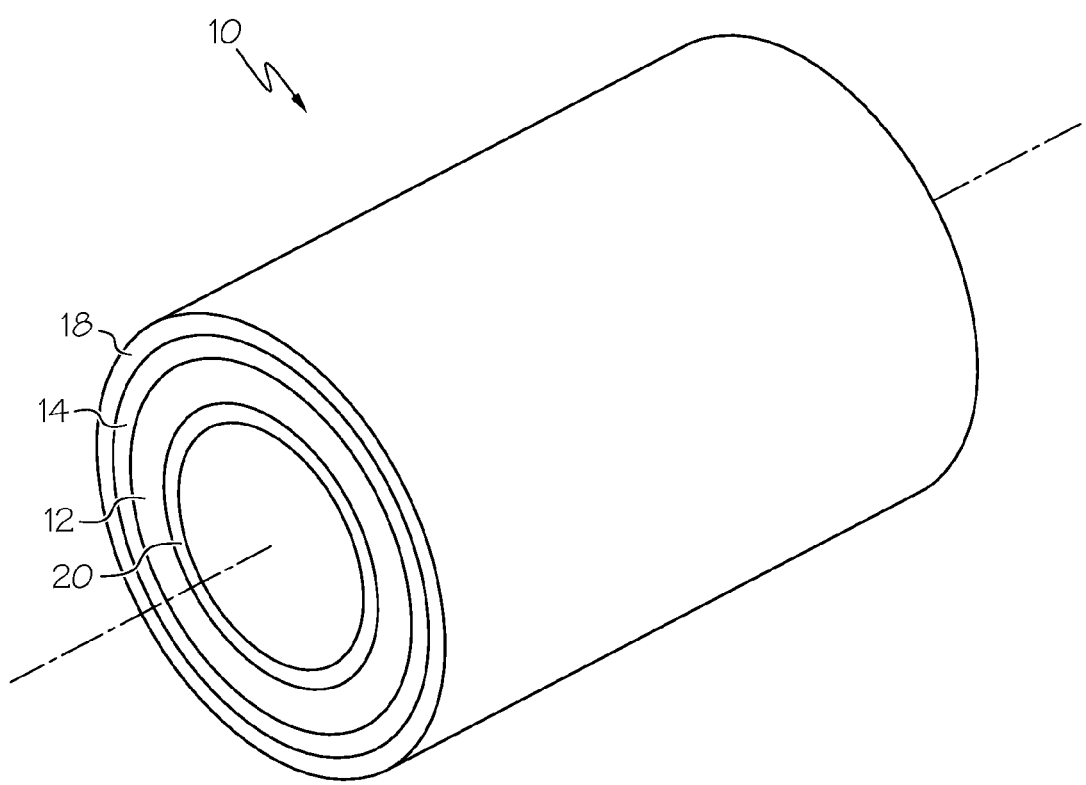
FIG. 1 is a perspective view of a printing sleeve in accordance with an embodiment of the invention.

Embodiments of the printing sleeve which include a meltable polymeric cord reinforcing layer or a polymeric reinforcing layer provide improved print quality. Where the polymeric reinforcing cord layer comprises a meltable cord layer, upon melting/softening at the temperatures used to cure the other materials making up the sleeve, the flow of the cord material reduces the thickness of the reinforcing layer and provides a smooth, uniform surface.

Where the reinforcing layer comprises a polymeric material, the layer may be applied in a coating of the desired thickness which is also smooth and uniform, or the layer may be applied as a pre-formed film.

The use of a meltable cord layer or a polymeric reinforcing layer as described herein also allows one to increase the thickness of the compressible layer without increasing the overall thickness of the sleeve. During printing, this increased compressible layer thickness helps to keep the printing sleeve cooler, and prevents the sleeve from experiencing compression set, i.e., permanent deformation. The reinforcing layer also increases the useful life of the printing sleeve by permitting the sleeve to run cooler and by reducing local differential shear stresses that are associated with the discontinuous nature of cord reinforcing layers that are typically used in current sleeves. In addition, the printing sleeve avoids the occurrence of the slurring of ink dots which can occur once the sleeve warms to normal press operating temperatures, i.e., the layers in the printing sleeve remain stable such that the ink dots formed on the substrate to be printed (e.g., paper) do not slur or streak.

While the invention is described herein with regard to a printing sleeve, it should be appreciated that embodiments of the reinforcing layer (cord reinforcing layer or polymeric reinforcing layer) may also be included in a printing blanket construction.

Unless otherwise indicated, the disclosure of any ranges in the specification and claims are to be understood as including the range itself and also anything subsumed therein, as well as endpoints.

The printing sleeve preferably includes a base layer comprised of nickel or fiberglass. The compressible layer preferably comprises nitrile rubber but may also comprise other rubber or elastomeric materials including ethylene/ propylene rubber, EPDM, butyl rubber, fluoroelastomers, polyurethane, and blends thereof. The compressible layer is preferably applied to the base layer in a conventional manner such as, for example, knife coating, spinning, flow coating, roll coating, and the like.

The first polymeric cord reinforcing layer is comprised of a material selected from fluorinated ethylene propylene, linear low density polyethylene, polyethylene, polypropylene, nylon copolymers, polyester copolymers, high density polyethylene, and ethylene/propylene copolymers, all of which melt at the temperatures used to cure the materials in the sleeve. Preferred materials for use include RF7253 thermo-fusible monofilaments commercially available from Luxilon Industries. The monofilaments may be used alone or combined to form a multifilament cord.

However, it should be appreciated that any suitable polymers may be used as long as they melt/soften at a temperature of between about 100° C. to 200° C. and flow and bond to adjacent cords to provide a smooth surface. It should also be appreciated that use of thinner cords spun at a high thread count (TPI) will result in a smoother surface. By TPI, it is meant threads per inch. This is the measurement used when cords are spun continuously around the sleeve in a spiral pattern and represents the number of cords per inch in a particular sleeve design.

The cord reinforcing layer is preferably spun onto the compressible layer, i.e., wound around the sleeve over the compressible layer in a conventional manner. The cord may be processed through a dip tank containing a suitable adhesive such as a rubber cement or other commercially available adhesives prior to being wound around the sleeve. If desired, a primer or adhesive may be applied to the cords, compressible layer, and/or print layer to enhance adhesion between layers and materials. Suitable primers for use include Lord Chemlock® 205 and Lord Chemlock® 233x, commercially available from Lord Corporation. Such primers may be applied by any known conventional methods including brushing, wiping, spraying, roll coating, and the like.

A second cord reinforcing layer may also be included in the sleeve and located between the first reinforcing cord layer and the compressible layer. The additional cord is preferably comprised of a polymeric material, such as spun polyester, polyamide, or aramid fibers, such as Kevlar®. This spun cord layer remains stable when exposed to the final curing temperatures, i.e., it does not melt at temperatures below 200° C.

Alternatively, the first (meltable) cord reinforcing layer may be spun simultaneously with a second (non-melting) spun cord layer to form a hybrid reinforcing layer in which the first cords will soften and flow to adjacent cords during final cure of the sleeve.

Where the reinforcing layer comprises a polymeric reinforcing layer, the layer is preferably in the form of a film having a thickness between about 0.003 inches and 0.010 inches. The polymeric reinforcing layer is preferably comprised of nitrile rubber, or other rubber or elastomeric materials. The polymeric material may also comprise high strength thermoplastic or thermosetting polymers such as polyester, polycarbonate, and rigid polyurethane, which may be cured with conventional curing agents or which may be cured by UV or electron beam radiation.

The polymeric reinforcing layer may optionally include reinforcing fillers such as carbon black, clay, silica, or any other suitable filler materials. The polymeric reinforcing layer may also optionally include reinforcing fiber materials such as chopped fiberglass, Kevlar® pulp, woven and non-woven fabric, chopped fibers, continuous filaments, cords, and the like. The fiber materials may be comprised of glass, metal, carbon, or synthetic or natural textile materials.

A printing surface layer is applied over the cord reinforcing layer by knife coating, roll coating, flow coating, extrusion, calendaring, lamination, and the like. Suitable materials for use as the print surface layer include nitrile rubber or other rubber or elastomeric materials including ethylene/propylene rubber, EPDM, butyl rubber, fluoroelastomers, polyurethane, and blends thereof.

After application of the print surface layer, the sleeve is cured at a temperature of between about 225° F. and 350° F. (107° C. to 177° C.) by the application of heat, or by heating in a heated chamber. At least a portion of the cord reinforcing layer then softens/melts and flows to fill the spaces between adjacent cords. The melted cord layer adheres to itself and to the adjacent layers, i.e., the compressible layer and adjacent printing surface layer. It should be appreciated that the cords melt and flow prior to flowing of the print surface layer such that the printing layer does not flow into the areas between the cords. Alternatively, the cords may be heated and melted before the print surface layer is applied over the reinforcing layer.

After curing, the sleeve is then cooled to ambient temperature, which causes the cord layer to re-solidify.

Figure 2A:
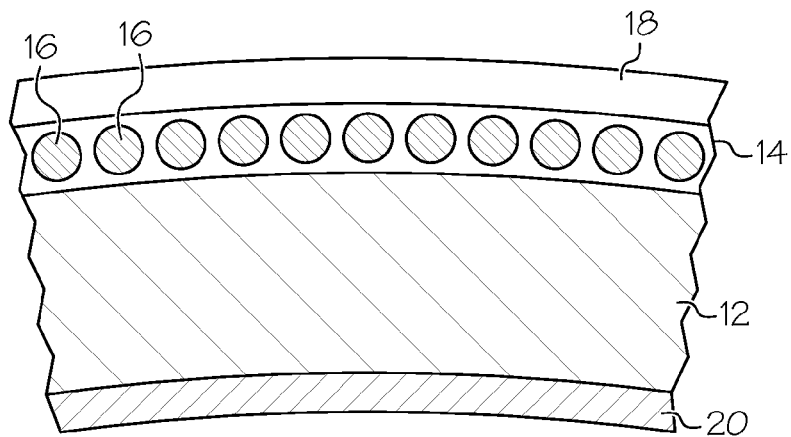
FIG. 2A is a cross-sectional view of the sleeve illustrating the embodiment including a meltable spun cord reinforcing layer.
Figure 2B:
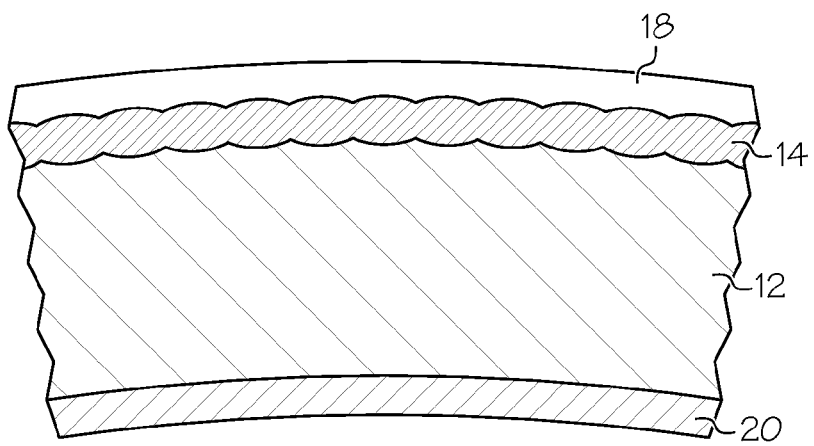
FIG. 2B is a cross-sectional view of the sleeve of FIG. 2A which has been subjected to curing temperatures.

Referring now to FIG. 1, an embodiment of the printing sleeve 10 is shown. As shown in FIG. 1 and in cross-section in FIG. 2A, the printing sleeve includes a compressible layer 12, a first polymeric cord reinforcing layer 14 comprised of meltable cords 16, and a print surface layer 18. The sleeve also includes a base layer 20 comprising a pressure expandable material such as a thin layer of a metal foil such as nickel or fiberglass. In the embodiment shown, the sleeve has not been subjected to a curing operation and the cord layer has a thickness of about 0.008 to 0.010 inches (0.20 to 0.254 mm). In the embodiment shown in FIG. 2B, the printing sleeve has been subjected to curing temperatures such that at least a portion of the cord layer has melted and flowed to adjacent cords to provide a reduced cord layer thickness of about 0.003 to 0.008 inches (0.076 to 0.2032 mm).

Figure 2C:
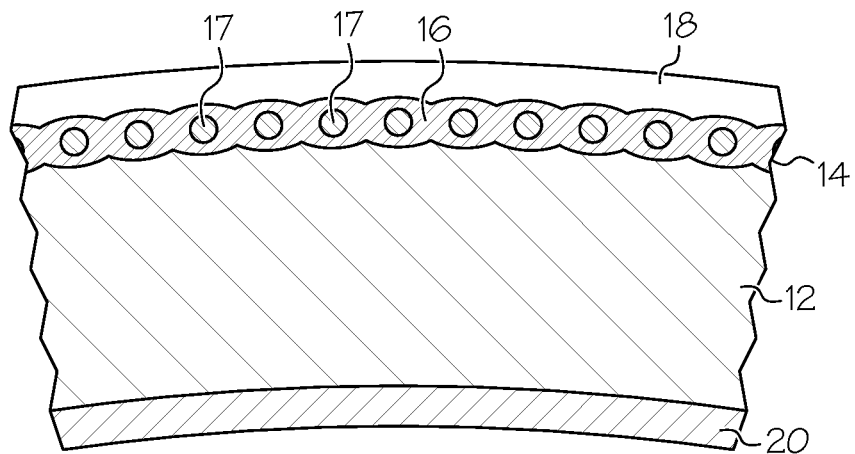
FIG. 2C is a cross-sectional view of a sleeve illustrating a hybrid reinforcing layer in accordance with another embodiment of the invention.

In yet another embodiment illustrated in FIG. 2C, a printing sleeve is shown which includes a hybrid reinforcing layer 14 comprised of meltable cords 16 and (non-melting) spun cords 17. In this embodiment, the meltable cords may be spirally wrapped in parallel with conventional (non-melting) spun cords. As described above, during the curing step, the meltable cords melt and flow around the non-melting cords to form a hybrid reinforcing layer which exhibits a smooth surface.

Figure 3:
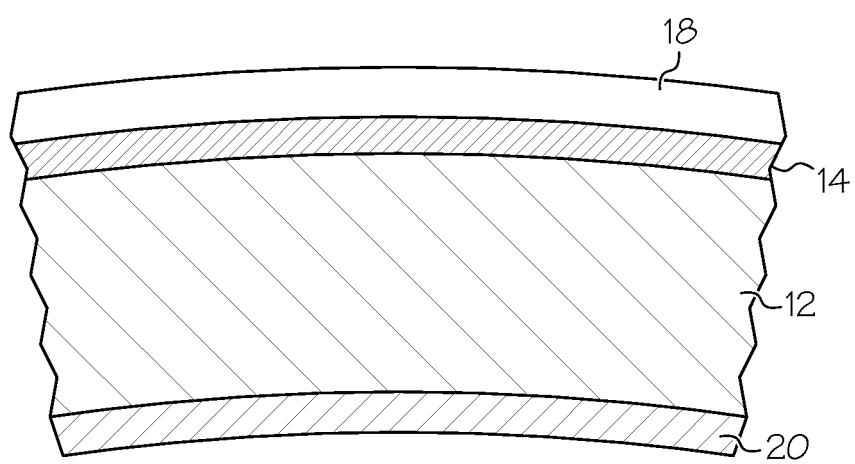
FIG. 3 is a cross-sectional view of a printing sleeve utilizing a polymeric reinforcing layer in accordance with another embodiment of the invention.

Referring now to FIG. 3, another embodiment of the invention is illustrated in which the printing sleeve includes a polymeric reinforcing layer 14. The polymeric reinforcing layer may be applied by a number of conventional methods including knife coating, cement spreading, roll coating, ribbon coating, spray coating, extrusion, lamination, or any method which results in a smooth surface.

Alternatively, the polymeric layer may be wrapped around the sleeve as an extruded or calendared sheet, either as a full width sheet or in the form of narrow strips which are spirally wrapped around the compressible layer. Alternatively, the polymeric reinforcing layer may be applied as a coextruded layer on the second surface of the print surface layer.

Where the polymeric reinforcing layer is comprised of a thermoplastic material, after application, the reinforcing layer is cooled to a solid prior to application of the printing surface layer. Where thermosetting polymers are used, the reinforcing layer may be cured or partially cured to a consistency which may optionally be ground to the desired final dimensions to which the print layer may be applied. Alternatively, the thermosetting polymers may be coextruded onto the base (second surface) of the printing surface layer. In this instance, it is not necessary to cure or grind the reinforcing layer prior to applying the printing surface layer.

The use of primers or adhesives as described above may also be applied to the compressible layer and/or print layer to enhance adhesion of the polymeric reinforcing layer.

Because the polymeric reinforcing layer can be made very smooth, it may be thicker than cord reinforcing layers or other described reinforcing layers without causing print quality defects due to uneven surface texture or hardness of the printing face above the reinforcing layer. As a result, the polymeric reinforcing layer may be constructed at any desired thickness above the compressible layer in order to achieve desired reinforcing strength. When necessary to obtain optimum strength, the polymeric reinforcing layer may comprise a thickness that includes a portion of the normal thickness of the printing surface layer, in which case the printing surface gauge may be reduced to provide a final total thickness that is needed for the overall sleeve construction. Therefore, it is possible to optimize the total structure to increase the compressible layer gauge while also increasing the reinforcing layer gauge and reducing the printing surface gauge to achieve a sleeve that provides excellent print quality and long life.

The resulting printing sleeve provides excellent print quality when used in offset printing applications.

Having described the invention in detail and by reference to preferred embodiments thereof, it will be apparent that modifications and variations are possible without departing from the scope of the invention.

What is claimed is:

1. A printing sleeve comprising:
   a compressible layer;
   a first polymeric cord reinforcing layer wound around said compressible layer; wherein at least a portion of adjacent windings of spun cord have flowed together and bonded resulting in a thinner structure;
   a second cord reinforcing layer positioned below said first polymeric cord reinforcing layer, wherein said second cord reinforcing layer comprises a polymeric spun fiber having a melting point greater than 200° C.; and
   a printing surface layer on said first polymeric cord reinforcing layer, said printing surface layer comprising a rubber or elastomeric material.

2. The printing sleeve of claim 1 further comprising a base layer supporting said compressible layer, said base layer comprising a thin layer of metal foil or fiberglass.

3. The printing sleeve of claim 1 wherein said spun cord of the first polymeric cord reinforcing layer softens and flows at a temperature of between about 100 and 200° C.

4. The printing sleeve of claim 1 wherein said first polymeric cord reinforcing layer comprises the spun cord.

5. The printing sleeve of claim 1 wherein said first polymeric cord reinforcing layer comprises a material selected from the group consisting of fluorinated ethylene propylene, linear low density polyethylene, polyethylene, polypropylene, nylon copolymers, polyester copolymers, high density polyethylene, and ethylene/propylene copolymers.

6. The printing sleeve of claim 1 wherein said first polymeric cord reinforcing layer has a thickness of about 0.008 to 0.010 inches (0.20 to 0.25 mm) prior to heating or curing.

7. The printing sleeve of claim 1 wherein said first polymeric cord reinforcing layer has a thickness of about 0.003 to 0.008 inches (0.076 to 0.2032 mm) after heating or curing.

8. The printing sleeve of claim 1 wherein said compressible layer has a thickness of about 0.021 to 0.025 inches (0.53 mm to 0.63 mm).

9. A printing sleeve comprising:
   a compressible layer;
   a first polymeric cord reinforcing layer wound around said compressible layer; wherein at least a portion of adjacent windings of spun cord have flowed together and bonded resulting in a thinner structure;
   a second cord reinforcing layer positioned below said first polymeric cord reinforcing layer, wherein said second cord reinforcing layer comprises a polymeric spun fiber having a melting point greater than 200° C.; and
   a printing surface layer on said first polymeric cord reinforcing layer.

10. The printing sleeve of claim 9 wherein said polymeric spun fiber of said second cord reinforcing layer is comprised of a material selected from polyester, polyamides and aramid.

11. The printing sleeve of claim 1 in which said printing surface layer comprises a material selected from the group consisting of nitrile rubber, a copolymer of ethylene/propylene rubber, EPDM, butyl rubber, polyurethane, and blends thereof.

12. The printing sleeve of claim 1 in which said compressible layer comprises a volume compressible material.

13. The printing sleeve of claim 12 in which said compressible layer includes voids.

14. A printing sleeve comprising:
   a base layer comprising a pressure expandable material;
   a volume compressible layer over sad base layer;
   a first polymeric cord reinforcing layer comprising one or more of monofilament and multiple filament materials wound around said compressible layer; wherein at least a portion of adjacent windings of said monofilament and filament materials have flowed together and bonded to form a reinforcing layer having reduced thickness;
   a second cord reinforcing layer positioned below said first polymeric cord reinforcing layer, wherein said second cord reinforcing layer comprises a polymeric spun fiber having a melting point greater that 200° C.; and
   a printing surface layer on said cord reinforcing layer, said printing surface layer comprising a rubber or elastomeric material.

15. A printing sleeve comprising:
   a compressible layer;
   a first polymeric cord reinforcing layer wound around said compressible layer, said polymeric cord layer comprising a polymer which softens and flows at a temperature of between about 100 and 2000 C.;
   a second cord reinforcing layer positioned below said first polymeric cord reinforcing layer, wherein said second cord reinforcing layer comprises polymeric spun fiber having a melting point greater than 200° C.; and
   a printing surface layer on said cord reinforcing layer, said printing surface layer comprising a rubber or elastomeric material.

16. The printing sleeve of claim 15 further comprising a base layer supporting said compressible layer, said base layer comprising a thin layer of metal foil or fiberglass.

17. The printing sleeve of claim 15 wherein said first polymeric cord reinforcing layer comprises the spun cord.

18. The printing sleeve of claim 15 wherein said polymeric spun fiber of said second cord reinforcing layer is comprised of a material selected from polyester, polyamide, and aramid.

* * * * *